(12) United States Patent
Chang et al.

(10) Patent No.: US 11,024,704 B1
(45) Date of Patent: Jun. 1, 2021

(54) MANUFACTURING METHOD OF CAPACITOR STRUCTURE

(71) Applicant: United Semiconductor (Xiamen) Co., Ltd., Fujian (CN)

(72) Inventors: Wei-Chun Chang, Fujian (CN); Han-Min Huang, Hsinchu (TW); You-Di Jhang, New Taipei (TW); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 0 days.

(21) Appl. No.: 16/802,481

(22) Filed: Feb. 26, 2020

(30) Foreign Application Priority Data

Feb. 5, 2020 (CN) .......................... 202010080565.0

(51) Int. Cl.
| | | |
|---|---|---|
| *H01G 7/00* | (2006.01) | |
| *H01G 4/00* | (2006.01) | |
| *H01G 4/30* | (2006.01) | |
| *H01G 4/38* | (2006.01) | |
| *H01L 49/02* | (2006.01) | |

(52) U.S. Cl.
CPC .............. *H01L 28/56* (2013.01); *H01L 28/65* (2013.01); *H01L 28/82* (2013.01)

(58) Field of Classification Search
CPC ......... H01L 28/87; H01L 28/82; H01L 28/40; H01L 28/60; H01L 28/65; H01L 28/56; H01G 4/30; H01G 4/38; H01G 4/385; H01G 4/302; H01G 4/306; H01G 4/33; H01G 7/00; H01G 5/011
See application file for complete search history.

(56) References Cited

U.S. PATENT DOCUMENTS

| | | | | |
|---|---|---|---|---|
| 2006/0157792 | A1* | 7/2006 | Konushi ................ | H01G 4/306 257/359 |
| 2006/0234442 | A1* | 10/2006 | Yamazaki .............. | H01L 28/75 438/250 |
| 2008/0212257 | A1* | 9/2008 | Sakamoto ............... | H01G 4/30 361/305 |

* cited by examiner

*Primary Examiner* — Omar F Mojaddedi
(74) *Attorney, Agent, or Firm* — Winston Hsu (57) ABSTRACT

A manufacturing method of a capacitor structure includes the following steps. A first capacitor is formed on a substrate. The first capacitor includes a first electrically conductive pattern and a second electrically conductive pattern of a first electrically conductive layer and a first dielectric layer disposed therebetween in a horizontal direction. A second capacitor is formed on the substrate before forming the first capacitor. The second capacitor includes a third electrically conductive pattern and a fourth electrically conductive pattern of a second electrically conductive layer and a second dielectric layer disposed therebetween in the horizontal direction. A thickness of the second electrically conductive layer is monitored. A target value of a thickness of the first electrically conductive layer is controlled in accordance with a value of a monitored thickness of the second electrically conductive layer.

20 Claims, 6 Drawing Sheets

MANUFACTURING METHOD OF CAPACITOR STRUCTURE

BACKGROUND OF THE INVENTION

1. Field of the Invention

The present invention relates to a manufacturing method of a capacitor structure, and more particularly, to a manufacturing method of a capacitor structure including a plurality of capacitors.

2. Description of the Prior Art

In modern society, the micro-processor systems composed of integrated circuits (ICs) are applied popularly in our living. Many electrical products, such as personal computers, mobile phones, and home appliances, include applications of ICs. With the development of technology and the increasingly imaginative applications of electrical products, the design of ICs tends to be smaller, more delicate and more diversified.

In the recent electrical products, IC devices, such as metal oxide semiconductor (MOS) transistors, capacitors, or resistors, are produced from silicon based substrates that are fabricated by semiconductor manufacturing processes. Generally, a capacitor structure may be composed of two electrodes and a dielectric layer sandwiched between the two electrodes. The capacitor structure may be located in an inter-metal dielectric (IMD) layer above a substrate and may be formed by the back end of line (BEOL) processes. However, the capacitor structure tends to be influenced by the process variations of the BEOL processes and it is difficult to control the capacitance of the capacitor structure accordingly. Therefore, the manufacturing method has to be modified for improving the capacitance stability of the capacitor structure.

SUMMARY OF THE INVENTION

A manufacturing method of a capacitor structure is provided in the present invention. A value of a monitored thickness of an electrically conductive layer configured for forming a capacitor is used to control a target value of a thickness of an electrically conductive layer configured for forming a next capacitor. The stability of the total capacitance of the capacitor structure may be improved accordingly.

According to an embodiment of the present invention, a manufacturing method of a capacitor structure is provided. The manufacturing method includes the following steps. A first capacitor is formed on a substrate. The first capacitor includes a first electrically conductive pattern of a first electrically conductive layer, a second electrically conductive pattern of the first electrically conductive layer, and a first dielectric layer disposed between the first electrically conductive pattern and the second electrically conductive pattern in a horizontal direction. A second capacitor is formed on the substrate before the step of forming the first capacitor. The second capacitor includes a third electrically conductive pattern of a second electrically conductive layer, a fourth electrically conductive pattern of the second electrically conductive layer, and a second dielectric layer disposed between the third electrically conductive pattern and the fourth electrically conductive pattern in the horizontal direction. A thickness of the second electrically conductive layer is monitored. A target value of a thickness of the first electrically conductive layer is controlled in accordance with a value of a monitored thickness of the second electrically conductive layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 7-9 are schematic drawings illustrating a manufacturing method of a capacitor structure according to an embodiment of the present invention, wherein FIG. 8 is a schematic drawing in a step subsequent to FIG. 7, and FIG. 9 is a schematic drawing in a step subsequent to FIG. 8.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
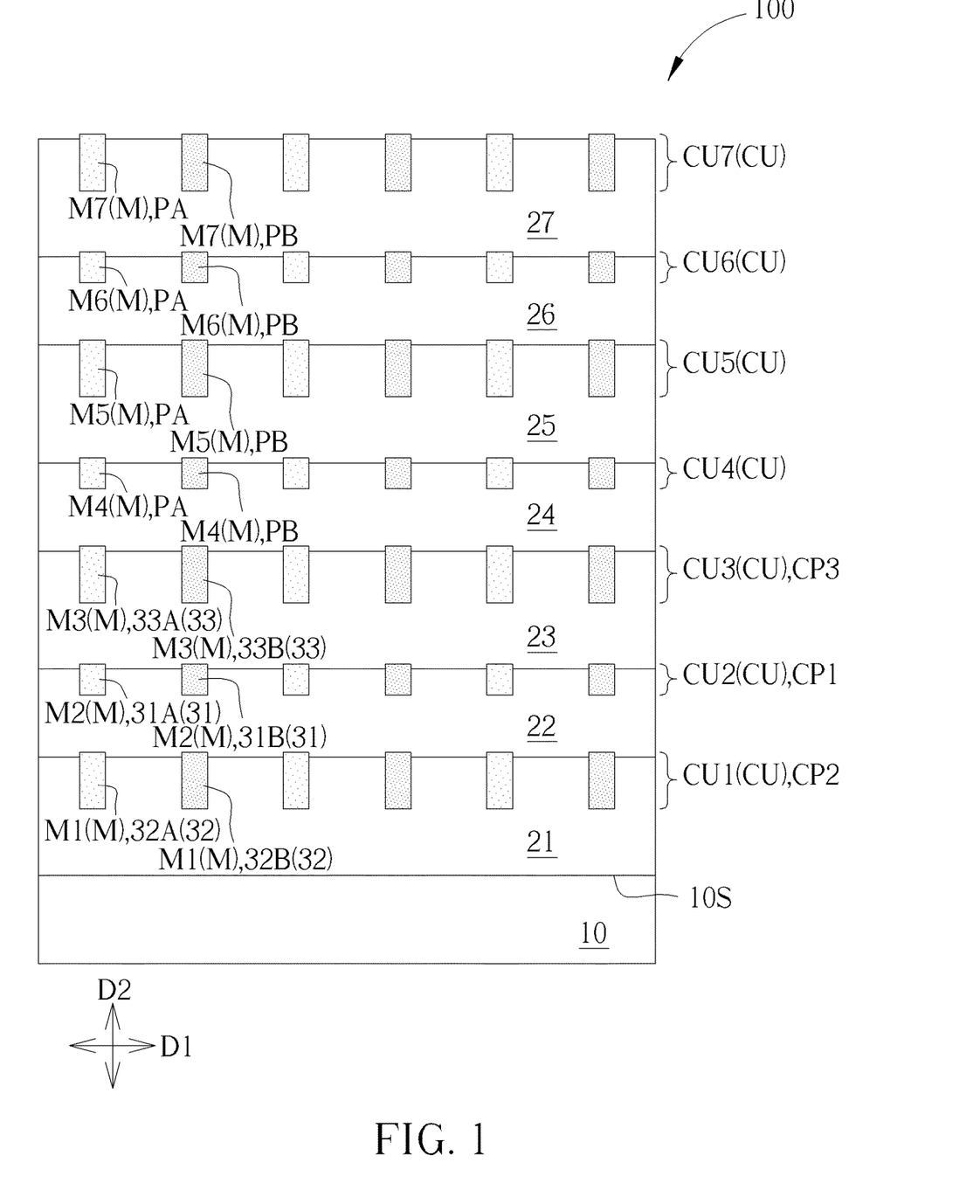
FIG. 1 is a schematic drawing illustrating a capacitor structure according to an embodiment of the present invention.
Figure 2:
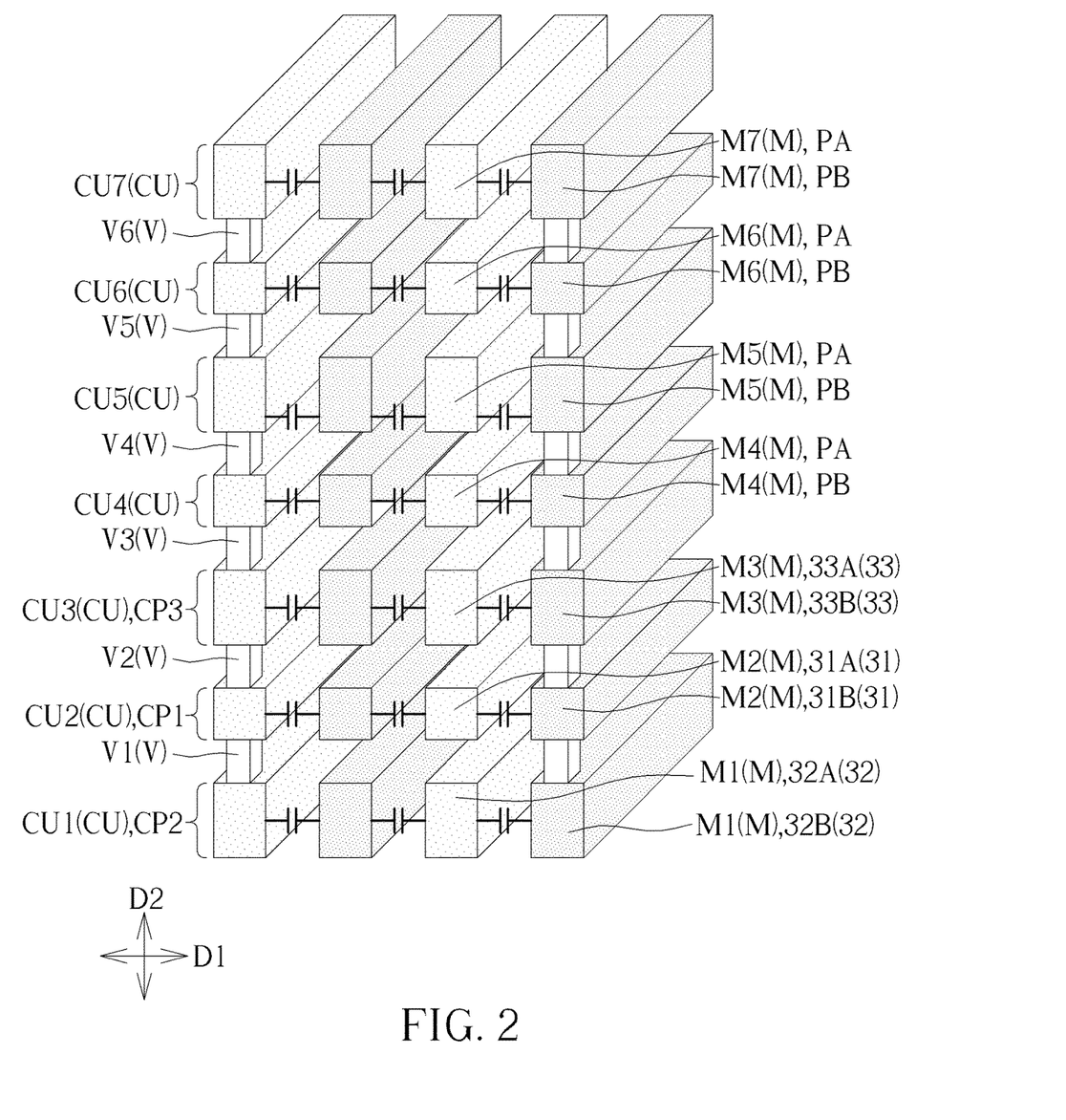
FIG. 2 is a stereoscopic schematic drawing illustrating a capacitor structure according to an embodiment of the present invention.
Figure 3:
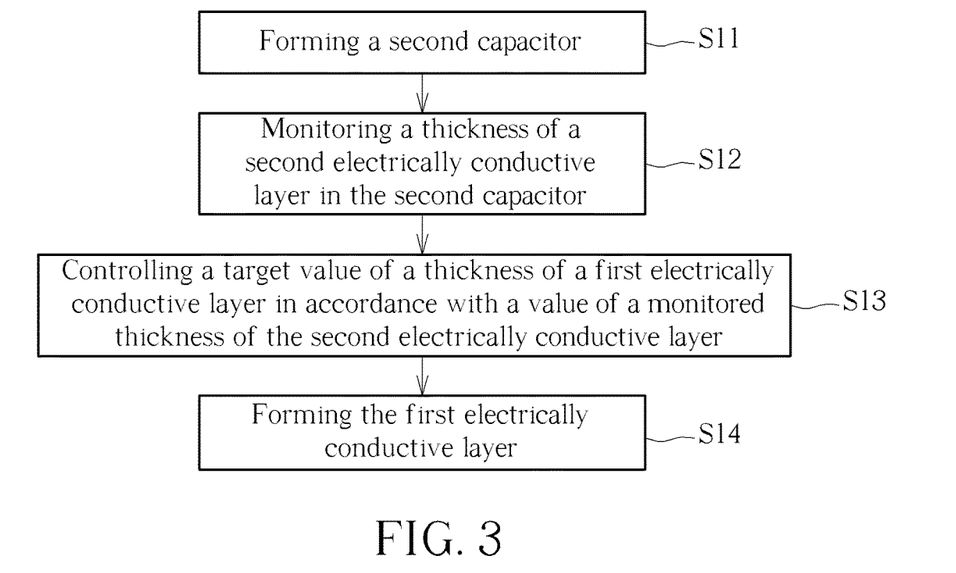
FIG. 3 is a flow chart of a manufacturing method of a capacitor structure according to an embodiment of the present invention.

Please refer to FIGS. 1-3. FIG. 1 is a schematic drawing illustrating a capacitor structure according to an embodiment of the present invention, FIG. 2 is a stereoscopic schematic drawing illustrating the capacitor structure in this embodiment, and FIG. 3 is a flow chart of a manufacturing method of a capacitor structure according to an embodiment of the present invention. As shown in FIG. 1 and FIG. 2, a capacitor structure 100 is provided in this embodiment. The capacitor structure 100 includes a substrate 10 and a plurality of capacitor units CU (such as a first capacitor unit CU1, a second capacitor unit CU2, a third capacitor unit CU3, a fourth capacitor unit CU4, a fifth capacitor unit CU5, a sixth capacitor unit CU6, and a seventh capacitor unit CU7 shown in FIG. 1, but not limited thereto) stacked in a thickness direction of the substrate 10 (such as a vertical direction D2 shown in FIG. 1). Each of the capacitor units CU may include electrically conductive patterns of a metal layer M (such as an electrically conductive pattern PA and an electrically conductive pattern PB shown in FIG. 1) and a dielectric layer (such as a dielectric layer 21, a dielectric layer 22, a dielectric layer 23, a dielectric layer 24, a dielectric layer 25, a dielectric layer 26, and/or a dielectric layer 27 shown in FIG. 1), and the dielectric layer may be at least partially disposed between the electrically conductive pattern PA and the electrically conductive pattern PB in a horizontal direction D1 for forming a metal-dielectric-metal capacitor. In some embodiments, the horizontal direction D1 may be parallel to a surface 10S of the substrate 10, and the vertical direction D2 may be the normal direction of the surface 10S of the substrate 10. Therefore, the horizontal direction D1 may be substantially orthogonal to the vertical direction D2, but not limited thereto. In some embodiments, each of the metal layers M may include a single layer or multiple layers of metallic electrically conductive materials, such as tungsten (W), aluminum (Al), copper (Cu), titanium aluminide (TiAl), titanium (Ti), titanium nitride (TiN), tantalum (Ta), tantalum nitride (TaN), titanium aluminum oxide (TiAlO), or other suitable metallic electrically conductive materials. Each of the dielectric layers may include a single layer or multiple layers of dielectric materials, such as oxide (e.g. silicon oxide), oxynitride (e.g. silicon oxynitride), or other suitable dielectric materials. In some embodiments, when the dielectric layers mentioned above include an oxide dielectric material, each of the capacitor units CU may include a metal-oxide-metal (MOM) capacitor unit, but not limited thereto.

In some embodiments, the substrate 10 may include a semiconductor substrate or a non-semiconductor substrate. The semiconductor substrate may include a silicon substrate, a silicon germanium substrate, or a silicon-on-insulator (SOI) substrate, and the non-semiconductor substrate may include a glass substrate, a plastic substrate, or a ceramic substrate, but not limited thereto. In addition, other active units (such as transistors, not shown) and/or passive units may be formed on the substrate 10 before the step of forming the dielectric layer 21 according to some considerations, and the capacitor units CU described above may be electrically connected to the active units and/or the passive units on the substrate 10, but not limited thereto. Additionally, in some embodiments, the capacitor structure 100 may further include a plurality of connection plugs V (such as a connection plug V1, a connection plug V2, a connection plug V3, a connection plug V4, a connection plug V5, and/or a connection plug V6 shown in FIG. 2, but not limited thereto) disposed between the metal layers M in the vertical direction D2 for electrically connecting the capacitor units CU. In other words, the capacitor units CU may be electrically connected with one another via the connection plugs V. In some embodiments, the capacitor units CU may be electrically connected with one another in parallel according to some design considerations, but not limited thereto. For instance, the electrically conductive patterns PA stacked in the vertical direction D2 may be electrically connected with one another via some of the connection plugs V, the electrically conductive patterns PB stacked in the vertical direction D2 may be electrically connected with one another via some of the connection plugs V, and the electrically conductive patterns PA may be separated from the electrically conductive patterns PB, but not limited thereto.

In some embodiments, the capacitor units CU may be electrically connected with one another in series and/or electrically connected with one another by other suitable approaches (such as a parallel and series hybrid approach) according to some design considerations. In addition, each of the connection plugs V may include a single layer or multiple layers of electrically conductive materials, such as tungsten, aluminum, copper, titanium aluminide, titanium, titanium nitride, tantalum, tantalum nitride, titanium aluminum oxide, or other suitable electrically conductive materials.

In some embodiments, the electrically conductive pattern PA may be separated from and may be not directly connected with the electrically conductive pattern PB in each of the metal layers M. A thickness of the electrically conductive pattern PA in the vertical direction D2, a thickness of the electrically conductive pattern PB in the vertical direction D2, and a thickness of the metal layer M in the vertical direction may be substantially equal to one another. In some embodiments, a portion of each of the metal layers M may be the electrically conductive pattern PA and the electrically conductive pattern PB in one of the capacitor units CU, and another portion of each of the metal layers M may be used to form and/or be an interconnection structure (not shown). In other words, the capacitor units CU and the interconnection structure may be formed concurrently by the back end of line (BEOL) processes, there is not any additional process required for forming the capacitor units CU, and the purpose of process simplification may be achieved accordingly. In addition, another portion of each of the dielectric layers described above (such as the dielectric layer 21, the dielectric layer 22, the dielectric layer 23, the dielectric layer 24, the dielectric layer 25, the dielectric layer 26, and/or the dielectric layer 27) may be used to form and/or be an inter-metal dielectric (IMD) where the interconnection structure described above is disposed, and the dielectric constant of each of the dielectric layer cannot be too high for avoiding negative influence on the interconnection structure (e.g. problems such as RC-delay). Therefore, as a dielectric layer with a higher dielectric constant is not suitable, the surface area of the dielectric layer sandwiched between the electrically conductive pattern PA and the electrically conductive pattern PB in the horizontal direction D1 may be increased for increasing the capacitance of each of the capacitor units CU.

In some embodiments, the topmost surface of each of the metal layers M may be slightly higher than the topmost surface of the corresponding dielectric layer, but not limited thereto. For example, the topmost surface of the first metal layer M1 may be higher than the topmost surface of the dielectric layer 21, and a portion of the dielectric layer 21 and a portion of the dielectric layer 22 may be disposed between the electrically conductive patterns of the first metal layer M1 in the horizontal direction D1 for forming the first capacitor unit CU1, but not limited thereto.

As shown in FIGS. 1-3, in some embodiments, the manufacturing method of the capacitor structure 100 may include the following steps. A first capacitor CP1 is formed on the substrate 10. The first capacitor CP1 includes a first electrically conductive pattern 31A and a second electrically conductive pattern 31B of a first electrically conductive layer 31 and a first dielectric layer (such as the dielectric layer 22). The first dielectric layer (such as the dielectric layer 22) is disposed between the first electrically conductive pattern 31A and the second electrically conductive pattern 31B in the horizontal direction D1. A second capacitor CP2 is formed on the substrate 10 before the step of forming the first capacitor CP1. The second capacitor CP2 includes a third electrically conductive pattern 32A and a fourth electrically conductive pattern 32B of a second electrically conductive layer 32 and a second dielectric layer (such as the dielectric layer 21). The second dielectric layer (such as the dielectric layer 21) is disposed between the third electrically conductive pattern 32A and the fourth electrically conductive pattern 32B in the horizontal direction D1. A thickness of the second electrically conductive layer 32 is monitored after the second electrically conductive layer 32 is formed. A target value of a thickness of the first electrically conductive layer 31 is controlled in accordance with a value of a monitored thickness of the second electrically conductive layer 32.

For example, the manufacturing method of the capacitor structure 100 may include but is not limited to the following steps. Firstly, in step S11, the second capacitor CP2 is formed on the substrate 10. Subsequently, in step S12, the thickness of the second electrically conductive layer 32 is monitored. In step S13, the target value of the thickness of the first electrically conductive layer 31 is controlled in accordance with the value of the monitored thickness of the second electrically conductive layer 32. Subsequently, in step S14, the first electrically conductive layer 31 is formed based on the target value of the thickness of the first electrically conductive layer 31, and the first capacitor CP1 may be formed accordingly. In other words, the value of the monitored thickness of the previous electrically conductive layer (such as the second electrically conductive layer 32) may be used to determine whether the target value of the thickness of the current electrically conductive layer (such as the first electrically conductive layer 31) has to be modified or not in the manufacturing method of this embodiment. Therefore, when the thickness deviation of the previous layer (such as a second electrically conductive layer 32) occurs, the thickness of the current layer (such as the first electrically conductive layer 31) may be adjusted for compensating the influence of the thickness deviation of the previous layer on the capacitance of the capacitor (such as the second capacitor CP2), and the total capacitance of the capacitor structure (such as the sum of the capacitance of the first capacitor CP1 and the capacitance of the second capacitor CP2) may be controlled accordingly.

Figure 4:
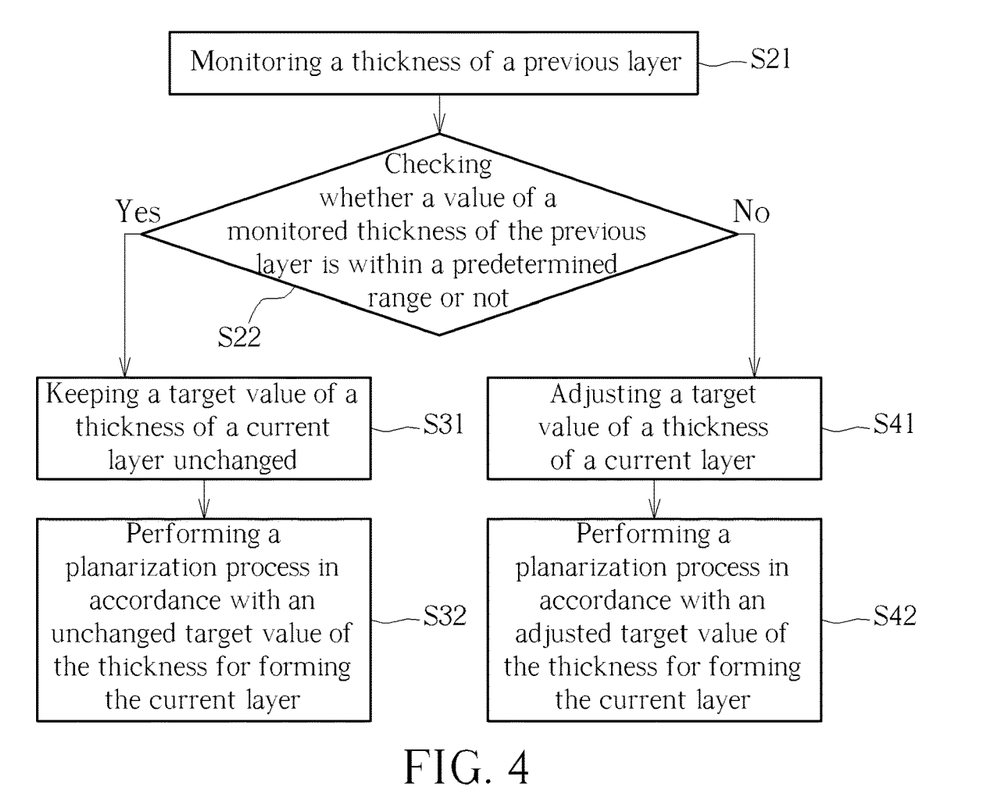
FIG. 4 is a flow chart of a portion of a manufacturing method of a capacitor structure according to an embodiment of the present invention.

Please refer to FIGS. 1-4. FIG. 4 is a flow chart of a portion of a manufacturing method of a capacitor structure according to an embodiment of the present invention. As shown in FIGS. 1-4, in some embodiments, the step of controlling the target value of the thickness of the first electrically conductive layer 31 may include but is not limited to the following steps. Firstly, in step S21, the thickness of the previous layer (such as the second electrically conductive layer 32) is monitored. Subsequently, in step S22, the value of the monitored thickness of the previous layer (such as the second electrically conductive layer 32) is checked for ensuring whether the value of the monitored thickness is within a predetermined range or not. Step S31 is carried out for keeping the target value of the thickness of the current layer (such as the first electrically conductive layer 31) unchanged when the value of the monitored thickness of the previous layer (such as the second electrically conductive layer 32) is within the predetermined range, and the unchanged target value of the thickness is used to execute related processes of forming the first electrically conductive layer 31. Comparatively, step S41 is carried out for adjusting the target value of the thickness of the current layer (such as the first electrically conductive layer 31) when the value of the monitored thickness of the previous layer (such as the second electrically conductive layer 32) is not within the predetermined range, e.g. when the value of the monitored thickness of the second electrically conductive layer 32 is out of the predetermined range, and the adjusted target value of the thickness is then used to execute related processes of forming the first electrically conductive layer 31.

In some embodiments, the first electrically conductive pattern 31A and the second electrically conductive pattern 31B may be a portion of the first electrically conductive layer 31. The first electrically conductive pattern 31A is separated from and is not directly connected with the second electrically conductive pattern 31B. The thickness of the first electrically conductive pattern 31A in the vertical direction D2, the thickness of the second electrically conductive pattern 31B in the vertical direction D2, and the thickness of the first electrically conductive layer 31 in the vertical direction D2 may be substantially equal to one another. Similarly, the third electrically conductive pattern 32A and the fourth electrically conductive pattern 32B may be a portion of the second electrically conductive layer 32. The third electrically conductive pattern 32A is separated from and is not directly connected with the fourth electrically conductive pattern 32B. The thickness of the third electrically conductive pattern 32A in the vertical direction D2, the thickness of the fourth electrically conductive pattern 32B in the vertical direction D2, and the thickness of the second electrically conductive layer 32 in the vertical direction D2 may be substantially equal to one another. In some embodiments, when another portion of the first electrically conductive layer 31 and another portion of the second electrically conductive layer 32 are used to form the interconnection structure (not shown), there may be a control range for controlling the thickness of each electrically conductive layer in the interconnection structure, and the predetermined range described above may be within the control range and narrower than the control range, but not limited thereto. In other words, the thickness control criterion for the electrically conductive pattern used to form the capacitor in the capacitor structure may be stricter than the thickness control criterion for each electrically conductive layer in the interconnect structure for improving the stability of the total capacitance of the capacitor structure. For example, the above-mentioned control range for controlling the thickness of each electrically conductive layer (such as the metal layer M) in the interconnection structure may be ±25% of the target value of the thickness, and the predetermined range for controlling the thickness of the electrically conductive layer (such as the second electrically conductive layer 32) in the capacitor structure may be ±15% of the target value of the thickness, but not limited thereto. The influence of the thickness deviation in each electrically conductive layer (but the thickness deviation may be still within the control range for controlling the thickness of each electrically conductive layer in the interconnection structure) on the total capacitance of the capacitor units CU may be improved by the controlling method described above.

Figure 5:
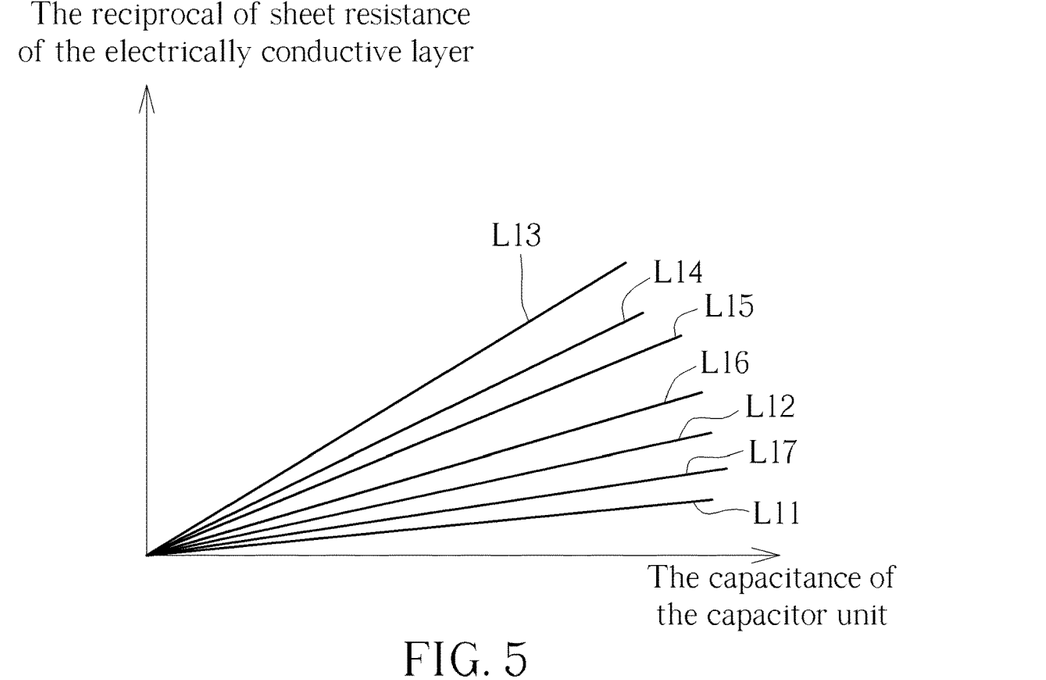
FIG. 5 is a schematic drawing illustrating a relationship between a reciprocal of sheet resistance of an electrically conductive layer in the capacitor structure and capacitance of corresponding capacitor unit according to an embodiment of the present invention.

Please refer to FIG. 5, FIG. 1, and FIG. 2. FIG. 5 is a schematic drawing illustrating a relationship between a reciprocal of sheet resistance of an electrically conductive layer in the capacitor structure and capacitance of corresponding capacitor unit according to an embodiment of the present invention, wherein the horizontal axis represents the capacitance of the capacitor unit, the vertical axis represents the reciprocal of the sheet resistance of the electrically conductive layer (such as the metal layer M). A line L11 stands for conditions of the above-mentioned first capacitor unit CU1 and the first metal layer M1, a line L12 stands for conditions of the above-mentioned second capacitor unit CU2 and the second metal layer M2, a line L13 stands for conditions of the above-mentioned third capacitor unit CU3 and the third metal layer M3, a line L14 stands for conditions of the above-mentioned fourth capacitor unit CU4 and the fourth metal layer M4, a line L15 stands for conditions of the above-mentioned fifth capacitor unit CU5 and the fifth metal layer M5, a line L16 stands for conditions of the above-mentioned sixth capacitor unit CU6 and the sixth metal layer M6, and a line L17 stands for conditions of the above-mentioned seventh capacitor unit CU7 and the seventh metal layer M7. According to a common calculation of capacitance (C=εA/d=ε(L*h)/d, wherein C stands for capacitance, ε stands for the dielectric constant of the dielectric layer, L may be regarded as the length of the dielectric layer sandwiched between the electrically conductive pattern PA and the electrically conductive pattern PB, h may be regarded as the thickness of the metal layer M, and d may be regarded as the distance between the electrically conductive pattern PA and the electrically conductive pattern PB), the capacitance of each of the capacitor units CU is proportional to the thickness of the metal layer M in the capacitor unit CU. According to a common calculation of sheet resistance (RS=ρ/t, wherein RS stands for sheet resistance, ρ stands for electrical resistivity, and t stands for the thickness of the film), the sheet resistance of each of the metal layers M is inversely proportional to the thickness of the metal layer M. Therefore, as shown in FIG. 5, FIG. 1, and FIG. 2, the capacitance of each of the capacitor units CU may be proportional to the reciprocal of the sheet resistance of the corresponding electrically conductive layer. In some embodiments, the slopes of each lines in FIG. 5 may be different from each other because the shapes of the electrically conductive patterns in the capacitor units CU and/or the design values of the thicknesses of the metal layers M may be different from one another and the manufacturing conditions of the metal layers M and/or the dielectric layers may be different from one another, but not limited thereto.

Figure 6:
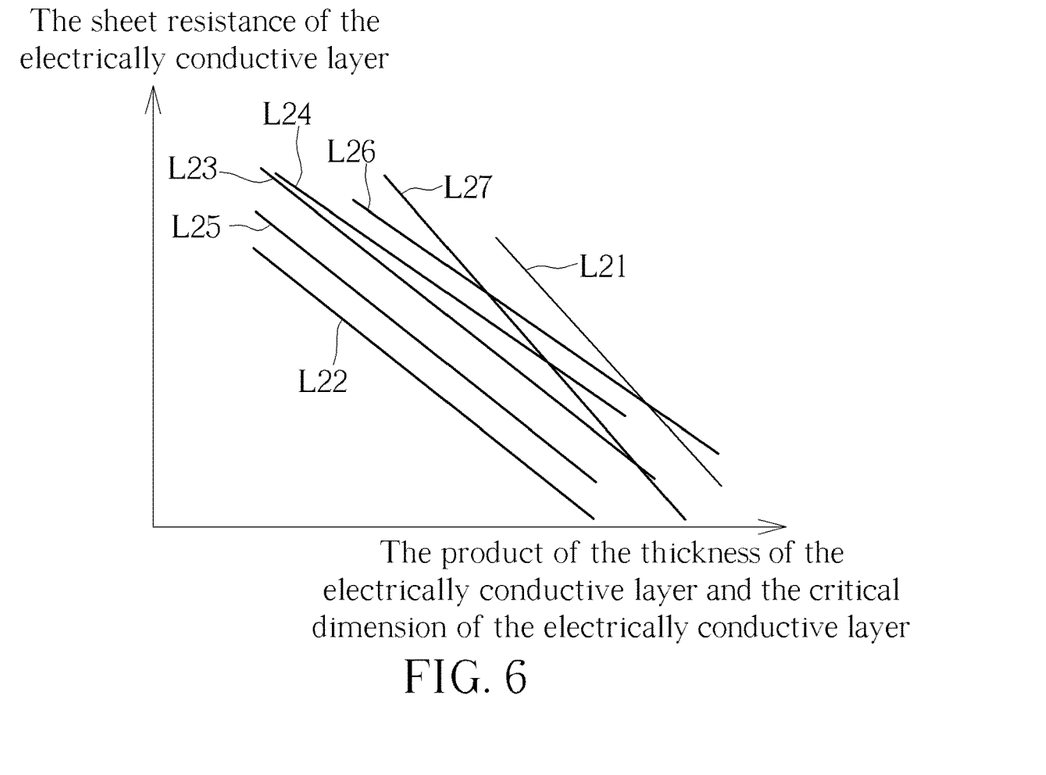
FIG. 6 is a schematic drawing illustrating a relationship between sheet resistance of an electrically conductive layer in the capacitor structure and a product of a thickness of the electrically conductive layer and a critical dimension of the electrically conductive layer.

Please refer to FIG. 6, FIG. 1, and FIG. 2. FIG. 6 is a schematic drawing illustrating a relationship between sheet resistance of an electrically conductive layer in the capacitor structure and a product of a thickness of the electrically conductive layer and a critical dimension (CD) of the electrically conductive layer, wherein the horizontal axis represents the product of the thickness of the electrically conductive layer (such as the metal layer M) and the critical dimension of the electrically conductive layer, the vertical axis represents the sheet resistance of the electrically conductive layer (such as the metal layer M). A line L21 stands for a condition of the first metal layer M1 described above, a line L22 stands for a condition of the second metal layer M2 described above, a line L23 stands for a condition of the third metal layer M3 described above, a line L24 stands for a condition of the fourth metal layer M4 described above, a line L25 stands for a condition of the fifth metal layer M5 described above, a line L26 stands for a condition of the sixth metal layer M6 described above, and a line L27 stands for a condition of the seventh metal layer M7 described above. As shown in FIG. 6, FIG. 1, and FIG. 2, the product of the thickness of the metal layer M in each capacitor unit CU and the critical dimension of the metal layer M may relate to the sheet resistance of the metal layer M (such as being inversely proportional to the sheet resistance of the metal layer M), and the slopes of each lines in FIG. 6 may be different from each other because the shapes of the electrically conductive patterns in the capacitor units CU and/or the design values of the thicknesses of the metal layers M may be different from one another and the manufacturing conditions of the metal layers M and/or the dielectric layers may be different from one another, but not limited thereto. Therefore, according to the actual manufacturing process results, the relationship diagram as shown in FIG. 6 may be drawn, and the ratio of the sheet resistance of each of the metal layer to the product of the thickness and the critical dimension of this meal layer M may be obtained from FIG. 6.

In some embodiments, the target value of the thickness of the first electrically conductive layer 31 may be calculated by the equation (I) listed below, but not limited thereto.

$$T_{3A} = \frac{RS_A - X_B \times T_{2B} \times C_{2B}}{X_A \times C_{2A}} \quad (I)$$

In the equation (I), $T_{3A}$ stands for the target value of the thickness of the first electrically conductive layer 31, $X_A$ stands for a coefficient of the sheet resistance of the first electrically conductive layer 31 versus the capacitance of the first capacitor CP1, $X_B$ stands for a coefficient of the sheet resistance of the second electrically conductive layer 32 versus the capacitance of the second capacitor CP2, $T_{2B}$ stands for the value of the monitored thickness of the second electrically conductive layer 32, $C_{2A}$ stands for a value of a monitored critical dimension of the first electrically conductive layer 31, $C_{2B}$ stands for a value of a monitored critical dimension of the second electrically conductive layer 32, and $RS_A$ stands for a design value of the sheet resistance of the first electrically conductive layer 31 and the second electrically conductive layer 32. In some embodiments, the critical dimension described above may be a line width of the electrically conductive pattern (such as the first electrically conductive pattern 31A, the second electrically conductive pattern 31B, the third electrically conductive pattern 32A, and/or the fourth electrically conductive pattern 32B), but not limited thereto. In addition, the coefficient of the sheet resistance of the first electrically conductive layer 31 versus the capacitance of the first capacitor CP1 (such as $X_A$) and the coefficient of the sheet resistance of the second electrically conductive layer 32 versus the capacitance of the second capacitor CP2 (such as $X_B$) may be calculated from the contents shown in FIG. 5 and/or FIG. 6 described above. In some embodiments, the coefficient of the sheet resistance of the first electrically conductive layer 31 versus the capacitance of the first capacitor CP1 (such as $X_A$) may be equal to the sheet resistance divided by the product of the thickness of the first electrically conductive layer 31 and the critical dimension of the first electrically conductive layer 31, and the coefficient of the sheet resistance of the second electrically conductive layer 32 versus the capacitance of the second capacitor CP2 (such as $X_B$) may be equal to the sheet resistance divided by the product of the thickness of the second electrically conductive layer 32 and the critical dimension of the second electrically conductive layer 32, but not limited thereto.

In some embodiments, the design value of the sheet resistance of the first electrically conductive layer 31 and the second electrically conductive layer 32 (such as $RS_A$) may calculated by the equation (II) listed below, but not limited thereto.

$$RS_A = X_A \times T_{1A} \times C_{1A} + X_B \times T_{1B} \times C_{1B} \qquad (II)$$

In the equation (II), $T_{1A}$ stands for a design value of the thickness of the first electrically conductive layer 31, $T_{1B}$ stands for a design value of the thickness of the second electrically conductive layer 32, $C_{1A}$ stands for a design value of the critical dimension of the first electrically conductive layer 31, and $C_{1B}$ stands for a design value of the critical dimension of the second electrically conductive layer 32. In some embodiments, the first capacitor CP1 may be electrically connected with the second capacitor CP2 in parallel according to some design considerations, and the sheet resistance of the first electrically conductive layer 31 and the second electrically conductive layer 32 may be calculated by the equation (II) described above accordingly, but not limited thereto. In some embodiments, the first capacitor CP1 may be electrically connected with the second capacitor CP2 in series and/or by other suitable approaches (such as a parallel and series hybrid approach) according to some design considerations.

As shown in FIG. 1 and FIG. 2, in some embodiments, the manufacturing method of the capacitor structure 100 may further include forming a third capacitor CP3 on the substrate 10 after the step of forming the first capacitor CP1. The third capacitor CP3 may include a fifth electrically conductive pattern 33A and a sixth electrically conductive pattern 33B of a third electrically conductive layer 33 and a third dielectric layer (such as the dielectric layer 23) disposed between the fifth electrically conductive pattern 33A and the sixth electrically conductive pattern 33B in the horizontal direction D1. Additionally, in some embodiments, the manufacturing method of the capacitor structure 100 may further include adjusting a target value of a thickness of the third electrically conductive layer 33 especially when the thickness deviation of the second electrically conductive layer 32 occurs and the thickness adjustment of the first electrically conductive layer 31 is not enough for compensating the thickness deviation of the second electrically conductive layer 32, but not limited thereto. In some embodiments, the target value of the thickness of the third electrically conductive layer 33 may be adjusted when the thickness of the second electrically conductive layer 32 is normal and a thickness deviation of the first electrically conductive layer 31 occurs.

In some embodiments, the target value of the thickness of the third electrically conductive layer 33 described above may be calculated by the equation (III) listed below, but not limited thereto.

$$T_{3C} = \frac{RS_C - X_B \times T_{2B} \times C_{2B} - X_A \times T_{2A} \times C_{2A}}{X_C \times C_{2C}} \qquad (III)$$

In the equation (III), $T_{3C}$ stands for the target value of the thickness of the third electrically conductive layer 33, $X_C$ stands for a coefficient of sheet resistance of the third electrically conductive layer 33 versus capacitance of the third capacitor CP3, $T_{2A}$ stands for a value of a monitored thickness of the first electrically conductive layer 31, $C_{2C}$ stands for a value of a monitored critical dimension of the third electrically conductive layer 33, and $RS_C$ stands for a design value of sheet resistance of the first electrically conductive layer 31, the second electrically conductive layer 32, and the third electrically conductive layer 33. Similarly, the critical dimension of the third electrically conductive layer 33 may be a line width of the fifth electrically conductive pattern 33A and/or a line width of the sixth electrically conductive pattern 33B, and the coefficient of the sheet resistance of the third electrically conductive layer 33 versus the capacitance of the third capacitor CP3 (such as $X_C$) may be calculated from the contents shown in FIG. 5 and/or FIG. 6 described above, but not limited thereto. In some embodiments, the coefficient of the sheet resistance of the third electrically conductive layer 33 versus the capacitance of the third capacitor CP3 (such as $X_C$) may be equal to the sheet resistance divided by the product of the thickness of the third electrically conductive layer 33 and the critical dimension of the third electrically conductive layer 33, but not limited thereto.

Additionally, in some embodiments, the design value of the sheet resistance of the first electrically conductive layer 31, the second electrically conductive layer 32, and the third electrically conductive layer 33 (such as $RS_A$) may be calculated by the equation (IV) listed below, but not limited thereto.

$$RS_C = X_A \times T_{1A} \times C_{1A} + X_B \times T_{1B} \times C_{1B} + X_C \times T_{1C} \times C_{1C} \qquad (IV)$$

In the equation (IV), $T_{1C}$ stands for a design value of the thickness of the third electrically conductive layer 33, and $C_{1C}$ stands for a design value of the critical dimension of the third electrically conductive layer. In some embodiments, the first capacitor CP1, the second capacitor CP2, and the third capacitor CP3 may be electrically connected with one another in parallel according to some design considerations, and the sheet resistance of the first electrically conductive layer 31, the second electrically conductive layer 32, and the third electrically conductive layer 33 may be calculated by the equation (IV) described above accordingly, but not limited thereto. For example, the third electrically conductive pattern 32A, the first electrically conductive pattern 31A, and the fifth electrically conductive pattern 33A may be electrically connected with one another via some of the connection plugs V, and the fourth electrically conductive pattern 32B, the second electrically conductive pattern 31B, and the sixth electrically conductive pattern 33B may be electrically connected with one another via some of the connection plugs V, but not limited thereto. In some embodiments, the first capacitor CP1, the second capacitor CP2, and the third capacitor CP3 may be electrically connected with one another in series and/or by other suitable approaches (such as a parallel and series hybrid approach) according to some design considerations.

In some embodiments, the target value of the thickness of the metal layer M in each of the capacitor units CU may be adjusted in accordance with the values of the monitored thickness and the monitored critical dimension of the metal layers M formed before this metal layer M. For example, the first capacitor CP1 described above may be the nth capacitor unit of a plurality of capacitor units CU stacked on the substrate 10, the first electrically conductive layer 31 may be the nth metal layer of a plurality of metal layers M stacked on the substrate 10, and a target value of a thickness of the nth metal layer may be calculated by the equation (V) listed below, but not limited thereto.

$$T_{3n} = \frac{RS_n - \sum_{k=1}^{n-1} X_k \times T_{2k} \times C_{2k}}{X_n \times C_{2n}} \quad (V)$$

In the equation (V), $T_{3n}$ stands for the target value of the thickness of the nth metal layer, $X_k$ stands for a coefficient of sheet resistance of the kth metal layer of the plurality of the metal layers M versus capacitance of the kth capacitor unit of the plurality of the capacitor units CU, $X_n$ stands for a coefficient of sheet resistance of the nth metal layer versus capacitance of the nth capacitor unit, $T_{2k}$ stands for a value of a monitored thickness of the kth metal layer, $C_{2k}$ stands for a value of a monitored critical dimension of the kth metal layer, $C_{2n}$ stands for a value of a monitored critical dimension of the nth metal layer, $RS_n$ stands for a design value of sheet resistance of the metal layers from the first metal layer to the nth metal layer of the plurality of the metal layers M, k is a positive integer, and n is a positive integer larger than 1. The coefficient of the sheet resistance of the kth metal layer of the plurality of the metal layers M versus the capacitance of the kth capacitor unit of the plurality of the capacitor units CU (such as $X_k$) and the coefficient of the sheet resistance of the nth metal layer versus the capacitance of the nth capacitor unit (such as $X_n$) may be calculated from the contents shown in FIG. 5 and/or FIG. 6 described above, but not limited thereto. In some embodiments, the coefficient of the sheet resistance of the kth metal layer versus the capacitance of the kth capacitor unit of the plurality of the capacitor units CU (such as $X_k$) may be equal to the sheet resistance of the kth metal layer divided by the product of the thickness of the kth metal layer and the critical dimension of the kth metal layer, and the coefficient of the sheet resistance of the nth metal layer versus the capacitance of the nth capacitor unit (such as $X_n$) may be equal to the sheet resistance of the nth metal layer divided by the product of the thickness of the nth metal layer and the critical dimension of the nth metal layer, but not limited thereto.

In some embodiments, the design value of the sheet resistance of the metal layers from the first metal layer to the nth metal layer of the plurality of the metal layers M (such as $RS_n$) may be calculated by the equation (VI) listed below, but not limited thereto.

$$RS_n = \sum_{k=1}^{n} X_k \times T_{1k} \times C_{1k} \quad (VI)$$

In the equation (VI), $T_{1k}$ stands for a design value of the thickness of the kth metal layer, and $C_{1k}$ stands for a design value of the critical dimension of the kth metal layer. It is worth noting that, in some embodiments, the capacitor units CU may be electrically connected with one another in parallel according to some design considerations, and the sheet resistance of the metal layers from the first metal layer to the nth metal layer of the plurality of the metal layers M may be calculated by the equation (VI) described above accordingly, but not limited thereto.

As shown in FIG. 1 and FIG. 2, in some embodiments, the second capacitor CP2, the first capacitor CP1, and the third capacitor CP3 described above may be the first capacitor unit CU1, the second capacitor unit CU2, and the third capacitor unit CU3 in the plurality of the capacitor units CU stacked on the substrate 10 respectively, and the second electrically conductive layer 32, the first electrically conductive layer 31, and the third electrically conductive layer 33 described above may be the first metal layer M1, the second metal layer M2, and the third metal layer M3 in the plurality of the metal layers M stacked on the substrate 10 respectively, but not limited thereto. In some embodiments, the second capacitor CP2, the first capacitor CP1, and the third capacitor CP3 may be a metal-oxide-metal (MOM) capacitor respectively, but not limited thereto. In some embodiments, the target value of the thickness of the metal layer M in the capacitor unit CU formed after the step of forming the first capacitor unit CU1 may be adjusted in accordance with the values of the monitored thickness and the monitored critical dimension of the metal layers M formed before this mental layer M (such as in accordance with the approach shown in FIG. 4 described above) for improving the stability of the total capacitance of the capacitor structure 100.

Figure 7:
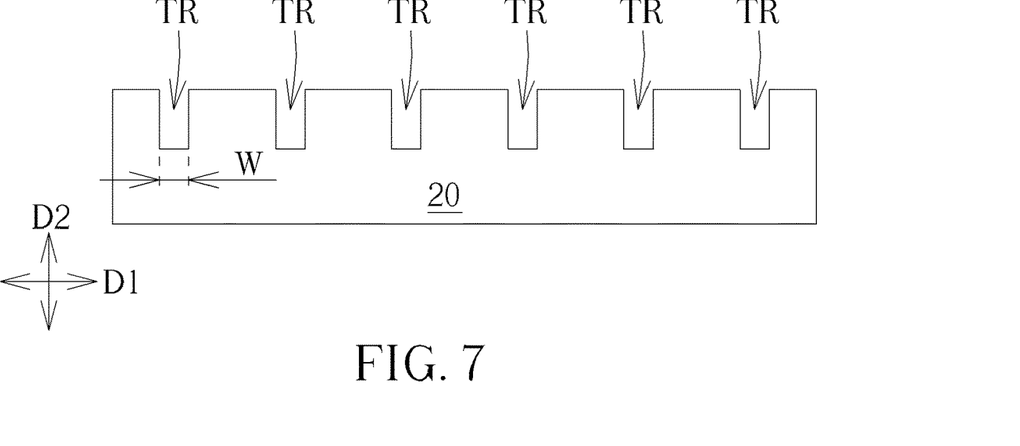
Figure 8:
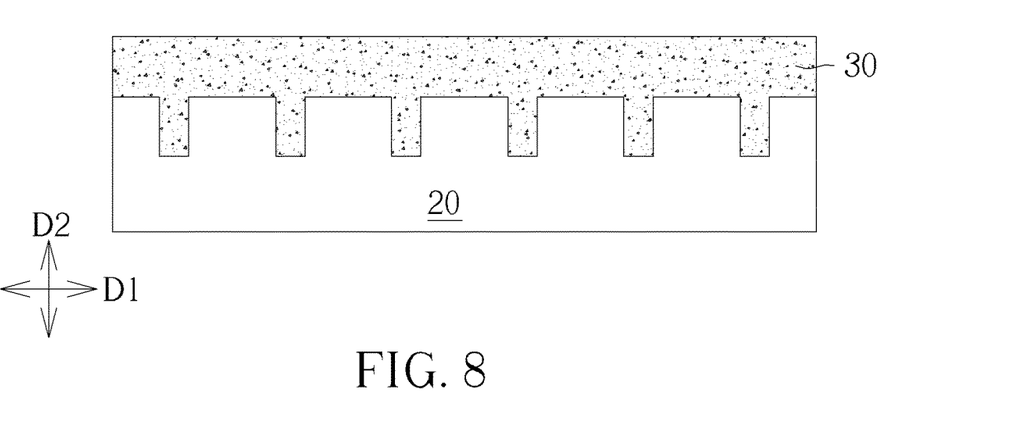
Figure 9:
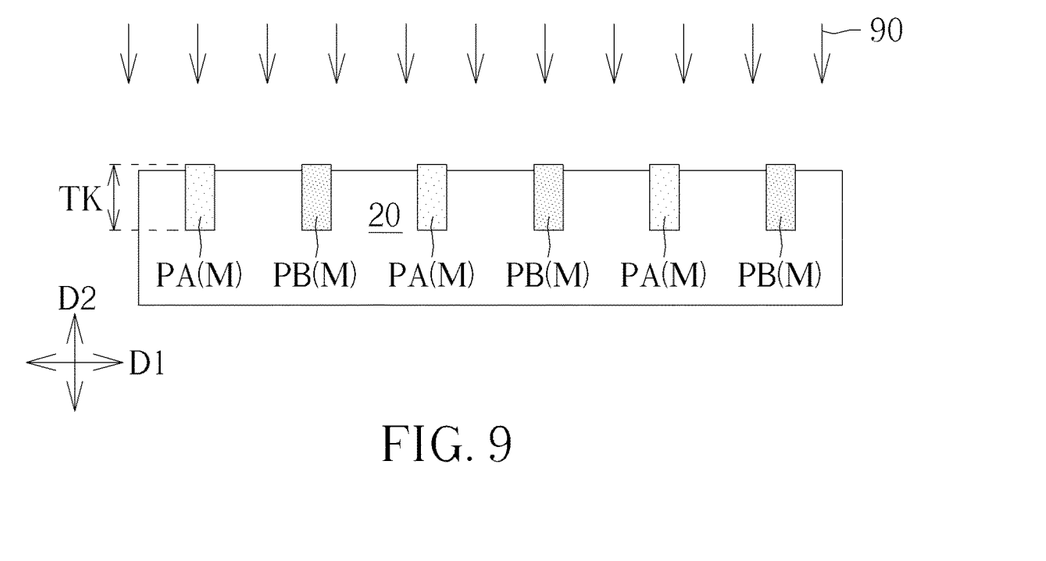

Please refer to FIGS. 7-9, FIG. 1, and FIG. 2. FIGS. 7-9 are schematic drawings illustrating a manufacturing method of a capacitor structure according to an embodiment of the present invention, wherein FIG. 8 is a schematic drawing in a step subsequent to FIG. 7, and FIG. 9 is a schematic drawing in a step subsequent to FIG. 8. In some embodiments, the manufacturing method shown in FIGS. 7-9 may correspond to the manufacturing method of at least one metal layer M of the metal layers M shown in FIG. 1 and FIG. 2. As shown in FIG. 7, a plurality of trenches TR may be formed in a dielectric layer 20, and the dielectric layer 20 may be the second dielectric layer (such as the dielectric layer 21), the first dielectric layer (such as the dielectric layer 22), the third dielectric layer (such as the dielectric layer 23), the dielectric layer 24, the dielectric layer 25, the dielectric layer 26, or the dielectric layer 27. Subsequently, as shown in FIG. 7 and FIG. 8, an electrically conductive material 30 is formed on the dielectric layer 20 and formed in the trenches TR, and the electrically conductive material 30 may include a single layer or multiple layers of electrically conductive materials, such as tungsten, aluminum, copper, titanium aluminide, titanium, titanium nitride, tantalum, tantalum nitride, titanium aluminum oxide, or other suitable electrically conductive materials. As shown in FIGS. 7-9, a planarization process 90 is then performed to the electrically conductive material 30 for removing the electrically conductive material 30 outside the trenches TR and forming the metal layer M including the electrically conductive pattern PA and the electrically conductive pattern PB. In some embodiments, the planarization process 90 may include a chemical mechanical polishing (CMP) process, an etching back process, or other suitable planarization approaches. In some embodiments, the critical dimension of each of the metal layers M (such as the line width of the electrically conductive pattern PA and the line width of the electrically conductive pattern PB) may be obtained indirectly by measuring a width W of each of the trenches TR, and the value of the monitored critical dimension of the current metal layer M may be obtained before the step of forming the electrically conductive material 30 accordingly. Therefore, the target value of the thickness of the current metal layer M may be calculated by the equation described above (such as the equation (V)), and the process parameters of the planarization process 90 may be modified in accordance with the target value for controlling the thickness TK of the metal layer M.

In some embodiments, the first electrically conductive layer 31 described above may be formed by the manufacturing method shown in FIGS. 7-9, but not limited thereto. As shown in FIGS. 7-9 and FIG. 1, the method of forming the first electrically conductive layer 31 may include but is not limited to the following steps. Firstly, a plurality of trenches (such as the trenches TR shown in FIG. 7) may be formed in the first dielectric layer (such as the dielectric layer 22). Subsequently, an electrically conductive material (such as the electrically conductive material 30 shown in FIG. 8) may be formed on the dielectric layer 22 and in the trenches TR. A planarization process (such as the planarization process 90 shown in FIG. 9) may then be performed to the electrically conductive material 30 for removing the electrically conductive material 30 outside the trenches TR and forming the first electrically conductive layer 31. Therefore, as shown in FIG. 1, FIG. 4, and FIG. 9, step S31 is carried out for keeping the target value of the thickness of the current layer (such as the first electrically conductive layer 31) unchanged when the value of the monitored thickness of the previous layer (such as the second electrically conductive layer 32) is within the predetermined range, and the planarization process 90 is performed in accordance with the unchanged target value of the thickness in step S32 for forming the current layer (such as the first electrically conductive layer 31). Comparatively, step S41 is carried out for adjusting the target value of the thickness of the current layer (such as the first electrically conductive layer 31) when the value of the monitored thickness of the previous layer (such as the second electrically conductive layer 32) is out of the predetermined range, and the planarization process 90 is performed in accordance with the adjusted target value of the thickness in step S42 for forming the current layer (such as the first electrically conductive layer 31).

It is worth noting that the manufacturing method of each of the metal layers M in the present invention is not limited to the method shown in FIGS. 7-9 described above. Each of the metal layers M in the capacitor structure 100 may be formed by other suitable manufacturing methods, and the process parameters of the manufacturing methods may be modified in accordance with the target value of the thickness described above.

Figure 10:
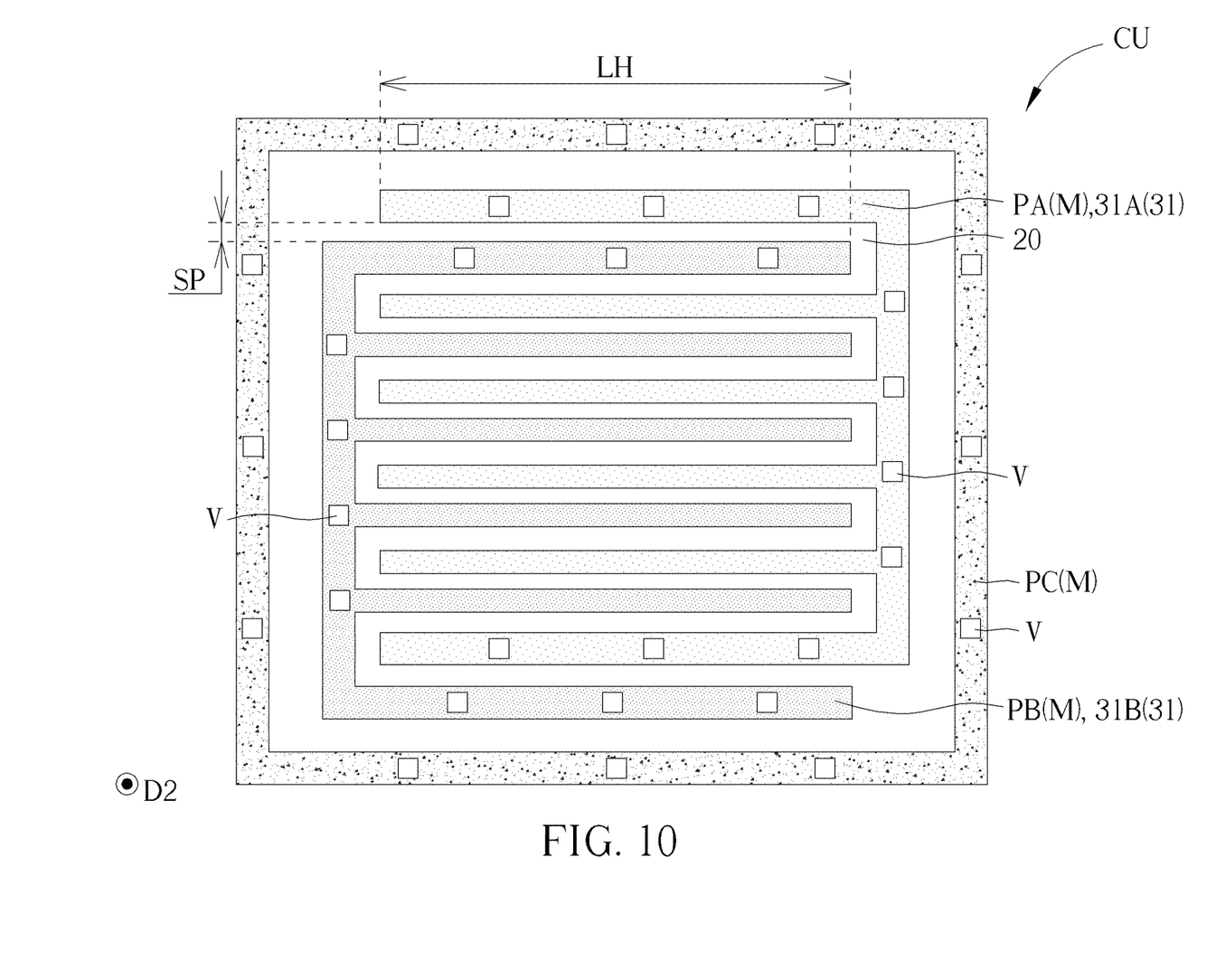
FIG. 10 is a schematic drawing illustrating a top view of a capacitor unit in a capacitor structure according to an embodiment of the present invention.

Please refer to FIG. 10, FIG. 1, and FIG. 2. FIG. 10 is a schematic drawing illustrating a top view of the capacitor unit CU in the capacitor structure 100 according to an embodiment of the present invention. As shown in FIG. 10, FIG. 1, and FIG. 2, in some embodiments, the electrically conductive pattern PA and the electrically conductive pattern PB in each of the capacitor units CU may be a finger pattern respectively. Each of the finger patterns may include stripe patterns extending in the same direction, and the stripe patterns of two finger patterns may be arranged alternately for forming a capacitor by the two finger patterns and the dielectric layer 20 sandwiched between the two finger patterns in the horizontal direction, but not limited thereto. In some embodiments, the electrically conductive pattern PA and the electrically conductive pattern PB in each of the capacitor units CU may have shapes different from the shapes shown in FIG. 10 in a top view of the capacitor unit CU according to some design considerations. For example, in the situation shown in FIG. 10, the capacitance of the capacitor unit CU may be calculated by the length of the stripe pattern, the spacing SP between the stripe patterns, the thickness of the metal layer M, and the dielectric constant of the dielectric layer 20, especially when the ratio of the length of the stripe pattern of each finger pattern to the width of the stripe pattern is relatively higher and the capacitance between the electrically conductive pattern PA and the electrically conductive pattern PB at the corners may be ignored in the calculation of the capacitance, but not limited thereto. Additionally, in some embodiments, each of the metal layers M may further include a shielding pattern PC surrounding the electrically conductive pattern PA and the electrically conductive pattern PB, and some of the connection plugs V may be electrically connected with the shielding pattern PC for applying reference voltage (such as ground voltage) to the shielding pattern PC and generating shielding effects, but not limited thereto. In some embodiments, the shielding pattern PC, the electrically conductive pattern PA, and the electrically conductive pattern PB may be separated from and may be not directly connected with one another, and the thicknesses of the shielding pattern PC, the electrically conductive pattern PA, and the electrically conductive pattern PB in the vertical direction D2 may be substantially equal to one another, but not limited thereto.

To summarize the above descriptions, in the manufacturing method of the capacitor structure according to the present invention, the value of the monitored thickness of the electrically conductive layer configured for forming the capacitor may be used to control the target value of the thickness of the electrically conductive layer configured for forming a next capacitor. The negative influence of the thickness deviation of the electrically conductive layer on the total capacitance of the capacitors may be compensated, and the stability of the total capacitance of the capacitor structure may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a capacitor structure, comprising:
    forming a first capacitor on a substrate, wherein the first capacitor comprises:
        a first electrically conductive pattern of a first electrically conductive layer;
        a second electrically conductive pattern of the first electrically conductive layer; and
        a first dielectric layer disposed between the first electrically conductive pattern and the second electrically conductive pattern in a horizontal direction;
    forming a second capacitor on the substrate before the step of forming the first capacitor, wherein the second capacitor comprises:
        a third electrically conductive pattern of a second electrically conductive layer;
        a fourth electrically conductive pattern of the second electrically conductive layer; and a second dielectric layer disposed between the third electrically conductive pattern and the fourth electrically conductive pattern in the horizontal direction;

monitoring a thickness of the second electrically conductive layer; and controlling a target value of a thickness of the first electrically conductive layer in accordance with a value of a monitored thickness of the second electrically conductive layer.

2. The manufacturing method of the capacitor structure according to claim 1, wherein the first capacitor and the second capacitor comprise a metal-oxide-metal (MOM) capacitor respectively.

3. The manufacturing method of the capacitor structure according to claim 1, wherein the controlling the target value of the thickness of the first electrically conductive layer comprises:

adjusting the target value of the thickness of the first electrically conductive layer when the value of the monitored thickness of the second electrically conductive layer is out of a predetermined range; and keeping the target value of the thickness of the first electrically conductive layer unchanged when the value of the monitored thickness of the second electrically conductive layer is within the predetermined range.

4. The manufacturing method of the capacitor structure according to claim 3, wherein the first capacitor is the nth capacitor unit of a plurality of capacitor units stacked on the substrate, the first electrically conductive layer is the nth metal layer of a plurality of metal layers stacked on the substrate, and a target value of a thickness of the nth metal layer is calculated by a following equation:

$$T_{3n} = \frac{RS_n - \sum_{k=1}^{n-1} X_k \times T_{2k} \times C_{2k}}{X_n \times C_{2n}}$$

wherein $T_{3n}$ stands for the target value of the thickness of the nth metal layer, $X_k$ stands for a coefficient of sheet resistance of the kth metal layer of the plurality of the metal layers versus capacitance of the kth capacitor unit of the plurality of the capacitor units, $X_n$ stands for a coefficient of sheet resistance of the nth metal layer versus capacitance of the nth capacitor unit, $T_{2k}$ stands for a value of a monitored thickness of the kth metal layer, $C_{2k}$ stands for a value of a monitored critical dimension of the kth metal layer, $C_{2n}$ stands for a value of a monitored critical dimension of the nth metal layer, $RS_n$ stands for a design value of sheet resistance of the metal layers from the first metal layer to the nth metal layer of the plurality of the metal layers, k is a positive integer, and n is a positive integer larger than 1.

5. The manufacturing method of the capacitor structure according to claim 4, wherein the design value of the sheet resistance of the metal layers from the first metal layer to the nth metal layer of the plurality of the metal layers is calculated by a following equation:

$$RS_n = \sum_{k=1}^{n} X_k \times T_{1k} \times C_{1k}$$

wherein $T_{1k}$ stands for a design value of a thickness of the kth metal layer, and $C_{1k}$ stands for a design value of a critical dimension of the kth metal layer.

6. The manufacturing method of the capacitor structure according to claim 4, wherein each of the plurality of the capacitor units comprises a metal-oxide-metal (MOM) capacitor unit.

7. The manufacturing method of the capacitor structure according to claim 4, wherein the plurality of the capacitor units are electrically connected with one another.

8. The manufacturing method of the capacitor structure according to claim 4, wherein the plurality of the capacitor units are electrically connected with one another in parallel.

9. The manufacturing method of the capacitor structure according to claim 3, wherein the target value of the thickness of the first electrically conductive layer is calculated by a following equation:

$$T_{3A} = \frac{RS_A - X_B \times T_{2B} \times C_{2B}}{X_A \times C_{2A}}$$

wherein $T_{3A}$ stands for the target value of the thickness of the first electrically conductive layer, $X_A$ stands for a coefficient of sheet resistance of the first electrically conductive layer versus capacitance of the first capacitor, $X_B$ stands for a coefficient of sheet resistance of the second electrically conductive layer versus capacitance of the second capacitor, $T_{2B}$ stands for the value of the monitored thickness of the second electrically conductive layer, $C_{2A}$ stands for a value of a monitored critical dimension of the first electrically conductive layer, $C_{2B}$ stands for a value of a monitored critical dimension of the second electrically conductive layer, and $RS_A$ stands for a design value of sheet resistance of the first electrically conductive layer and the second electrically conductive layer.

10. The manufacturing method of the capacitor structure according to claim 9, wherein the design value of the sheet resistance of the first electrically conductive layer and the second electrically conductive layer is calculated by a following equation:

$$RS_A = X_A \times T_{1A} \times C_{1A} + X_B \times T_{1B} \times C_{1B}$$

wherein $T_{1A}$ stands for a design value of the thickness of the first electrically conductive layer, $T_{1B}$ stands for a design value of the thickness of the second electrically conductive layer, $C_{1A}$ stands for a design value of a critical dimension of the first electrically conductive layer, and $C_{1B}$ stands for a design value of a critical dimension of the second electrically conductive layer.

11. The manufacturing method of the capacitor structure according to claim 9, wherein the first capacitor is electrically connected with the second capacitor.

12. The manufacturing method of the capacitor structure according to claim 9, wherein the first capacitor is electrically connected with the second capacitor in parallel.

13. The manufacturing method of the capacitor structure according to claim 3, further comprising:
- forming a third capacitor on the substrate after the step of forming the first capacitor, wherein the third capacitor comprises:
  - a fifth electrically conductive pattern of a third electrically conductive layer;
  - a sixth electrically conductive pattern of the third electrically conductive layer; and
  - a third dielectric layer disposed between the fifth electrically conductive pattern and the sixth electrically conductive pattern in the horizontal direction; and
- adjusting a target value of a thickness of the third electrically conductive layer, wherein the target value of the thickness of the third electrically conductive layer is calculated by a following equation:

$$T_{3C} = \frac{RS_C - X_B \times T_{2B} \times C_{2B} - X_A \times T_{2A} \times C_{2A}}{X_C \times C_{2C}}$$

wherein $T_{3C}$ stands for the target value of the thickness of the third electrically conductive layer, $X_A$ stands for a coefficient of sheet resistance of the first electrically conductive layer versus capacitance of the first capacitor, $X_B$ stands for a coefficient of sheet resistance of the second electrically conductive layer versus capacitance of the second capacitor, $X_C$ stands for a coefficient of sheet resistance of the third electrically conductive layer versus capacitance of the third capacitor, $T_{2A}$ stands for a value of a monitored thickness of the first electrically conductive layer, $T_{2B}$ stands for the value of the monitored thickness of the second electrically conductive layer, $C_{2A}$ stands for a value of a monitored critical dimension of the first electrically conductive layer, $C_{2B}$ stands for a value of a monitored critical dimension of the second electrically conductive layer, $C_{2C}$ stands for a value of a monitored critical dimension of the third electrically conductive layer, and $RS_C$ stands for a design value of sheet resistance of the first electrically conductive layer, the second electrically conductive layer, and the third electrically conductive layer.

14. The manufacturing method of the capacitor structure according to claim 13, wherein the design value of the sheet resistance of the first electrically conductive layer, the second electrically conductive layer, and the third electrically conductive layer is calculated by a following equation:

$$RS_C = X_A \times T_{1A} \times C_{1A} + X_B \times T_{1B} \times C_{1B} + X_C \times T_{1C} \times C_{1C},$$

wherein $T_{1A}$ stands for a design value of the thickness of the first electrically conductive layer, $T_{1B}$ stands for a design value of the thickness of the second electrically conductive layer, $T_{1C}$ stands for a design value of the thickness of the third electrically conductive layer, $C_{1A}$ stands for a design value of a critical dimension of the first electrically conductive layer, $C_{1B}$ stands for a design value of a critical dimension of the second electrically conductive layer, and $C_{1C}$ stands for a design value of a critical dimension of the third electrically conductive layer.

15. The manufacturing method of the capacitor structure according to claim 13, wherein the first capacitor, the second capacitor, and the third capacitor are electrically connected with one another.

16. The manufacturing method of the capacitor structure according to claim 15, wherein the first capacitor, the second capacitor, and the third capacitor are electrically connected with one another in parallel.

17. The manufacturing method of the capacitor structure according to claim 3, wherein a method of forming the first electrically conductive layer comprises:
- forming trenches in the first dielectric layer;
- forming an electrically conductive material on the first dielectric layer and in the trenches; and
- performing a planarization process to the electrically conductive material for removing the electrically conductive material outside the trenches.

18. The manufacturing method of the capacitor structure according to claim 17, wherein the planarization process is performed in accordance with an adjusted target value of the thickness of the first electrically conductive layer when the value of the monitored thickness of the second electrically conductive layer is out of the predetermined range.

19. The manufacturing method of the capacitor structure according to claim 17, wherein the planarization process is performed in accordance with an unchanged target value of the thickness of the first electrically conductive layer when the value of the monitored thickness of the second electrically conductive layer is within the predetermined range.

20. The manufacturing method of the capacitor structure according to claim 1, wherein the horizontal direction is parallel to a surface of the substrate.

* * * * *